United States Patent [19]

Brors

[11] 4,169,031
[45] Sep. 25, 1979

[54] MAGNETRON SPUTTER CATHODE ASSEMBLY

[75] Inventor: Daniel L. Brors, Los Altos, Calif.

[73] Assignee: Polyohm, Inc., Santa Clara, Calif.

[21] Appl. No.: 869,258

[22] Filed: Jan. 13, 1978

[51] Int. Cl.² ............................................. C23C 15/00
[52] U.S. Cl. .................................. 204/192 R; 204/298
[58] Field of Search ............................ 204/192 R, 298

[56] References Cited

U.S. PATENT DOCUMENTS

| | | | |
|---|---|---|---|
| 3,487,000 | 12/1969 | Hajzak | 204/298 |
| 3,544,445 | 12/1970 | Moseson | 204/298 |
| 3,730,873 | 5/1973 | Pompei | 204/192 E |
| 3,763,031 | 10/1973 | Scow | 204/298 |
| 3,853,740 | 12/1974 | Kunz | 204/298 |
| 3,956,093 | 5/1976 | McLeod | 204/298 |
| 4,060,470 | 11/1977 | Clarke | 204/298 |

FOREIGN PATENT DOCUMENTS

| | | | |
|---|---|---|---|
| 2149606 | 4/1973 | Fed. Rep. of Germany | 204/298 |
| 329252 | 3/1970 | U.S.S.R. | 204/298 |

*Primary Examiner*—John H. Mack
*Assistant Examiner*—William Leader

*Attorney, Agent, or Firm*—Harry E. Aine

[57] ABSTRACT

In a magnetron cathode sputter assembly for coating objects within an evacuated chamber, a disc of cathode material to be sputtered is supported over an annular magnet structure for producing crossed magnetic and electric fields over the sputter surface of the cathode disc to be sputtered for enhancing the glow discharge and the sputtering rate. The magnet structure is contained within a chamber in a hollow cylindrical receiving member and a clamp serves to clamp the cathode sputter disc over the open end of the receiving chamber. Coolant is circulated through the receiving chamber in heat exchanging relation with the cathode disc and with the magnet structure for cooling same in use. An internally flanged cylindrical shield structure is disposed overlying the outer peripheral edge of the cathode sputter disc and, in a preferred embodiment, the shield is permitted to operate by self biasing at a floating potential intermediate the anode and cathode potential. The sputter shield serves to prevent sputtering from undesired peripheral regions of the cathode structure. The hollow cylindrical cathode receiver member and the sputter shield are carried from an electrically insulative disc.

14 Claims, 2 Drawing Figures

U.S. Patent   Sep. 25, 1979   4,169,031
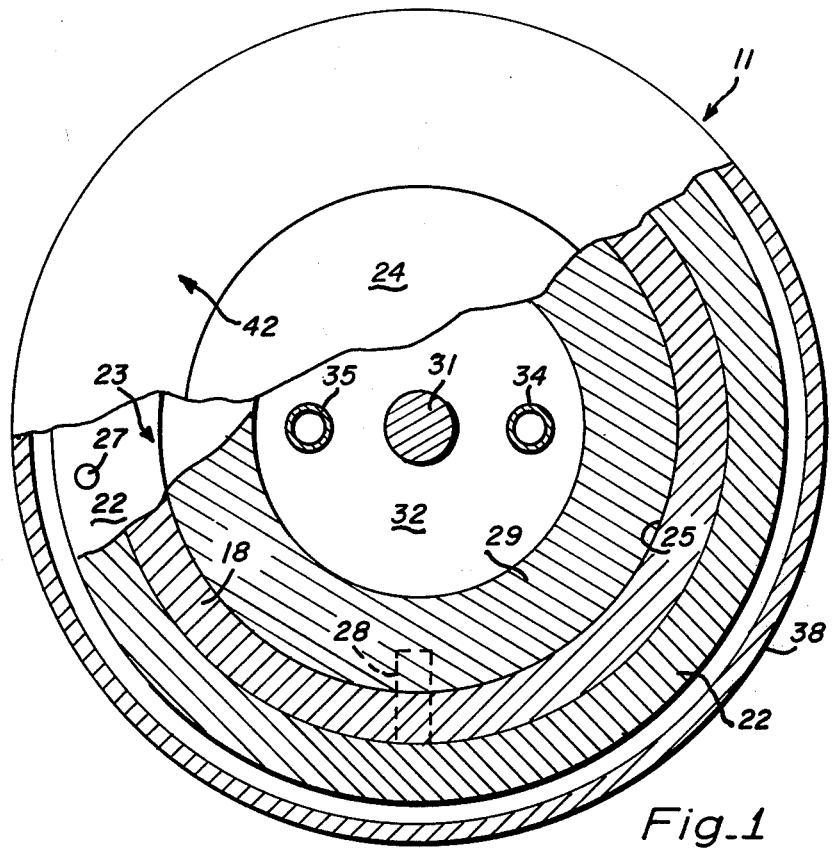
Fig_1
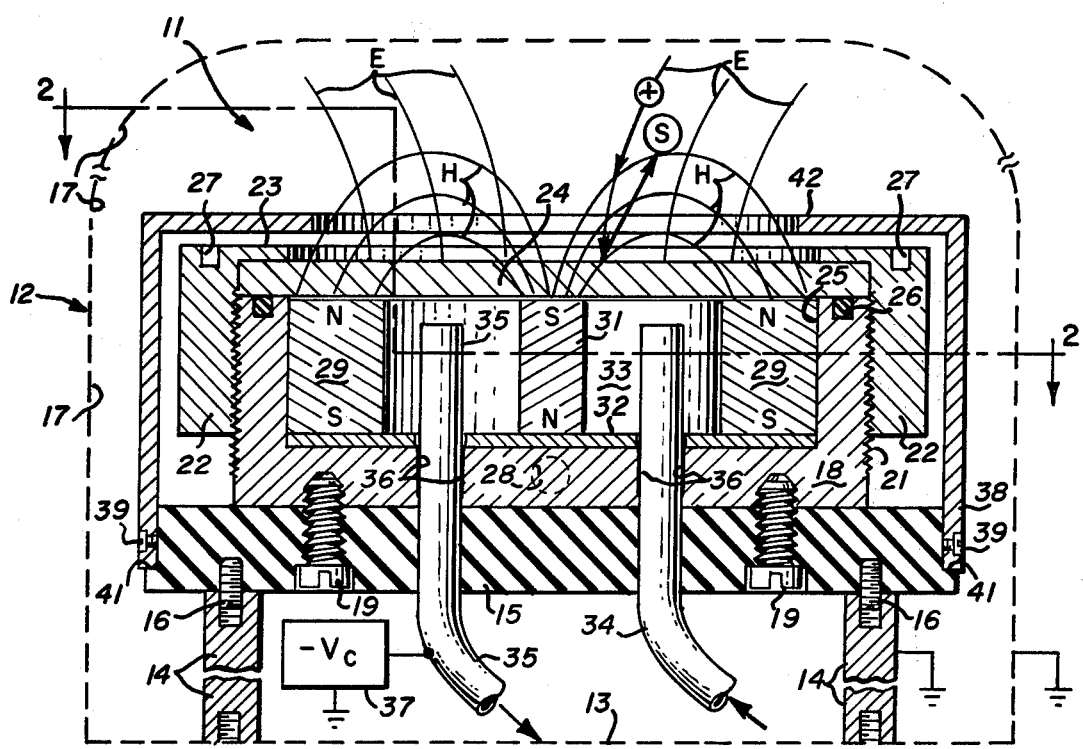
Fig_2

MAGNETRON SPUTTER CATHODE ASSEMBLY

BACKGROUND OF THE INVENTION

The present invention relates in general to sputter cathode assemblies and, more particularly, to an improved sputter cathode assembly of the magnetron type, i.e., wherein crossed electric and magnetic fields are employed over the sputtering surface of the cathode assembly to enhance the intensity of the glow discharge and to improve the sputtering rate.

DESCRIPTION OF THE PRIOR ART

Heretofore, a grounded sputter shield has been provided surrounding the periphery of the sputter cathode electrode in a magnetron type sputter cathode assembly. Such a sputter cathode assembly is disclosed in U.S. Pat. No. 4,060,470, issued Nov. 29, 1977. In one embodiment of the aforecited prior art, the sputter cathode is annular and inwardly dished and disposed coaxially of and surrounding a central anode electrode which cooperates with the grounded outer sputter shield. The central anode operated at or near the ground potential. The purpose of the sputter shield is to prevent undesired sputtering from regions of the sputter gun operating at cathode potential. Such shielded regions, in the prior art, included the magnet structure for producing the magnetic field over the sputter cathode surface.

In a second embodiment of the aforecited prior art, a ground shield surrounded the outer periphery of a circular cathode sputter disc for supplying a grounded anode potential in the vicinity of the cathode and for shielding certain regions of the cathode sputter gun operating at cathode potential. In both of the aforecited prior art devices an auxiliary magnet structure was provided for shaping the stray magnetic field in the region of the periphery of the cathode sputter plate in order to inhibit or prevent sputtering from undesired regions of the sputter cathode operating at cathode potential.

It is also known from the prior art to clamp the periphery of the cathode sputter plate or disc to the cathode electrode structure and to circulate a coolant in heat exchanging relation with the backside of the cathode sputter disc for cooling thereof in use. Disclosures of such clamping devices are found in U.S. Pat. Nos. 3,878,085 issued Apr. 15, 1975 and 3,956,093 issued May 11, 1976.

SUMMARY OF THE PRESENT INVENTION

The principal object of the present invention is provision of an improved magnetron sputter cathode assembly useful for sputter coating of objects within an evacuated chamber.

In one feature of the present invention, a sputter shield, operable at a potential intermediate the anode and cathode potential, is disposed overlying the outer periphery of the sputter cathode member for restricting the glow discharge to the desired central region of the cathode sputter member, whereby undesired sputtering from the cathode electrode structure is prevented in use.

In another feature of the present invention, the sputter shield floats electrically relative to the cathode and anode potentials so that the shield assumes a potential due to self biasing which is intermediate the potentials of the anode and cathode.

Other features and advantages of the present invention will become apparent upon a perusal of the following specification taken in connection with the accompanying drawings wherein:

BRIEF DESCRIPTION OF THE DRAWINGS

FIG. 1 is a longitudinal cross-sectional view, partly in schematic form, of a magnetron sputter cathode assembly incorporating features of the present invention, and FIG. 2 is a sectional view of a portion of the structure of FIG. 1 taken along line 2—2 in the direction of the arrows and being only partially broken away in certain regions.

DESCRIPTION OF THE PREFERRED EMBODIMENTS

Referring now to FIGS. 1 and 2, there is shown a magnetron sputter cathode assembly 11 incorporating features of the present invention. The cathode sputter assembly 11 is disposed within a conventional bell jar assembly, schematically indicated at 12 in FIG. 1. The bell jar assembly 12 includes an electrically conductive base plate portion 13, as of stainless steel, to which the sputter cathode assembly 11 is mounted via the intermediary of three or four conductive legs 14 mounted by a stud to the base plate 13 and to an electrically insulative circular mounting plate 15, as of nylon or Teflon via the intermediary of studs 16.

The bell jar 12 includes a domed shaped metallic screen or solid metallic jar member portion 17 which is electrically connected to the base plate 13 and operated at ground potential. Also within the bell jar 12 are located various fixtures, not shown, which are electrically conductively connected to ground for supporting the work pieces to be coated. In a typical example, the fixtures serve to rotate the work pieces in such a manner as to obtain uniform coating of the surfaces thereof to be coated with the sputtered cathode material.

A hollow cylindrical cup-shaped cathode receiving structure 18, as of non-magnetic stainless steel, is fixedly secured to the insulative mounting plate 15 via the intermediary of a plurality of cap screws 19. The exterior of the cathode receiving member 18 is threaded at 21 to receive an internally threaded clamping ring 22, as of non-magnetic stainless steel. The clamping ring 22 includes an inwardly directed flange portion or shoulder 23 which abuts the outer periphery of the sputtering face of a sputter cathode disc 24 and serves to clamp the disc 24 over the open end of a cylindrical chamber 25 formed in the cathode receiving member 18.

A sealing ring 26, as of neoprene, is carried within an annular groove at the lip of the cup-shaped cathode receiving member 18 for providing a fluid tight seal between the cathode sputter disc 24 and the cathode receiving member 18, thereby providing a fluid tight cylindrical chamber 25 within the cathode receiving member 18.

A plurality of axially directed bores 27 are provided in the upper end of the clamping ring 22 to receive the prongs carried from a forked wrench utilized for tightening the clamping ring 22 on the cathode receiving member 18. Similarly, a plurality of radially directed bores 28 in the base of the cathode receiving member 18 serve to receive prongs of a second forked wrench utilized for holding the cathode receiving member 18 stationary while tightening the clamping ring 22.

An annular axially polarized permanent magnet 29 is disposed within the cylindrical chamber 25 near the outer periphery thereof. A second oppositely axially polarized cylindrical permanent magnet 31 is centrally disposed coaxially of the outer permanent magnet 29. A disc-shaped magnetic yoke 32, as of soft iron, is disposed within the base of the cylindrical chamber 25 and serves as a magnetic yoke for the permanent magnets 29 and 31. The magnetic field, produced by the magnet structures, 29 and 31 loops out of the upper surface of the cathode sputter disc 24 and back into the disc 24 and through the disc to the center magnet 31 in the manner indicated by the lines marked with "H". The magnetic field lines "H" are generally orthogonal to the electric field lines "E" which originate on the grounded anode structure contained within or outside the bell jar 12 and which terminate on the cathode disc 24. The anode structure includes the bell jar portion 17 and/or workpiece fixtures.

In an annular region over the cathode disc 24, the electric and magnetic fields are generally orthogonal, thereby producing an intense magnetron type discharge therein, wherein the electrons which are generated over the cathode surface 24 are magnetically confined to paths along the magnetic field lines "H", oscillating to and fro along such lines between the points where such lines pass into the cathode disc 24. These electrons impact upon gaseous atoms, such as argon within the bell jar 12 at a pressure in the range of $10^{-2} - 10^{-4}$ Torr for producing ionization of the gaseous atoms. The positive ions travel along the electric field lines and impact on the sputter surface of the cathode disc 24 with substantial energies for sputtering cathode material from the sputter cathode disc 24 onto objects to be coated within the bell jar 12. The cathode sputter disc 24 is typically operated at a negative potential of 400 to 800 volts relative to the anode potential or ground potential.

The ion current collected by the cathode disc at this potential difference produces substantial heating of the cathode disc 24, in use. Heat is removed from the cathode disc 24 by means of fluid coolant, such as water, supplied to the annular portion 33 of the chamber 25, defined between the magnets 29 and 31 via an inlet coolant tubulation 34, as of copper. Coolant flows around the annular passageway 33 and is collected via output tubulation 35. The coolant tubes 34 and 35 pass through the base plate portion 13 of the bell jar 12 via a conventional vacuum tight feed-through assembly not shown. Operating potential is supplied to the cathode electrode structures 18 and 24 via the electrically conductive coolant tubes 34 and 35 which are brazed at 36 to the inside walls of axially directed bores in the base portion of the cup-shaped receiving member 18.

The brazed joint at 36 provides a fluid-tight joint between the tubulations 34 and 35 and the cathode receiving member 18. The tubes 34 and 35 also pass through apertures in the magnetic yoke 32. A cathode power supply is schematically indicated at 37 for supplying the negative cathode potential $V_c$ to the cathode relative to the ground or anode structure.

A hollow cylindrical cathode sputter shield 38, as of aluminum, is disposed surrounding the cathode receiving member 18 and clamp 22. The shield 38 is affixed to the outer peripheral edge of the insulative plate 15 via the intermediary of a plurality of radially directed screws 39 threadably mating with radially directed threaded bores in the shield 38. The screws 39 bear at their inner ends against the outer side wall of the insulator plate 15 for providing a gripping action between the shield 38 and the insulative disc 15. Annular shoulder 41 on the insulative disc 15 abuts the lower end of the cathode sputter shield 38 for determining the proper axial positioning of the shield 38 relative to the cathode electrode structure.

The upper end of the cathode sputter shield 38 includes an inwardly directed annular flange portion 42 which overlays the outer peripheral portion of the cathode sputter disc 24 and the clamping ring 22. In a preferred embodiment, the cathode sputter sheild 38 operates in a self biasing manner by being electrically insulated from both the anode and cathode so as to float electrically relative to the anode and cathode potentials at a potential intermediate these two potentials. The cathode sputter shield 38 serves to shape the electric field lines in the region of the glow discharge over the sputtering surface of the cathode sputter disc 24 in such a manner as to prevent establishment of an undesired electrical discharge and sputtering in the regions of the clamping structure 22 and from the cathode sputter shield itself 38.

In a typical example, where the cathode is operated at a potential of between 400 and 600 volts negative with respect to ground and ground is the anode potential, the floating sputter cathode shield 38 self biases itself to a potential of approximately $-250$ volts.

In an alternative embodiment, the cathode sputter shield 38 is operated at the desired intermediate potential by means of a separate power supply, not shown, which is disposed externally of the bell jar and connected to sputter shield 38 via a suitable lead structure not shown. In such a case, the sputter shield power supply voltage approximates the self bias potential, i.e., a potential midway between the anode and cathode potentials.

In case it is desired to sputter deposit an electrically insulative material, such as silicon, a disc of the electrically insulative material of substantially the same size as sputter disc 24 and which may be substantially thinner is disposed overlaying the electrically conductive cathode disc 24 in abutting relation, and is clamped in position to the disc 24 via clamping ring 22. A radio frequency potential, as of 13 MHz, is then applied to the cathode electrode structure via the electrically conductive fluid coolant tubes 35 and 34 in the manner as previously described. The power supply 37 would then be a radio frequency power supply with the ungrounded terminal thereof applied to the tubes 34 and 35.

The R.F. mode of operation is substantially identical to that employing DC potential during the half cycle portions when the voltage is sufficiently negative on the cathode electrode structure relative to the anode to establish a glow discharge. However, on the positive half cycles, the positive electrostatic potential tending to build up on the surface of the insulative cathode material is discharged by electron current flowing to the electrically insulative portion of the cathode sputter disc structure 24.

The floating sputter shield 38 changes the shape of the electric field over the sputtering surface of the cathode disc 24 so as to allow substantial sputtering rates down to $4 \times 10^{-4}$ Torr, which is approximately an order of magnitude lower pressure than that obtainable from a gun of the type disclosed in the aforecited U.S. Pat. No. 4,060,470.

What is claimed is:

1. In a magnetron cathode sputter assembly of the type including anode and cathode electrode means for operating at anode and cathode potentials in use for sputtering target material from a target region of a major face of said cathode electrode means onto an object to be coated with the sputtered material, such target region of said cathode electrode means being surrounded by a peripheral region of said major face of said cathode electrode means from which sputtering is undesired;

magnet means for producing a magnetic field over said cathode electrode means which has a substantial vector component orthogonally directed to the electric field vector over said cathode electrode and between said cathode and anode for enhancing the intensity of the glow discharge established over said cathode in use;

means for applying a cathode to anode electrode operating potential to said anode and cathode electrode for establishing an electrical glow discharge therebetween in use;

floating shield means surrounding said cathode electrode means and including a portion overlying said peripheral region of said major face of said cathode electrode means and from which sputtering is undesired for at least partially shielding said peripheral region of said cathode electrode means from sputtering; and insulator means for electrically insulating said floating shield means from said cathode and anode electrode means, such floating shield means being free of potential supplying means, such that said floating shield means is self biasing in use and allowed to assume an electrical potential in use intermediate that of said anode and cathode and which is allowed to float electrically relative to both of said anode and cathode potentials as supplied from sources of potential to said anode and cathode electrode means.

2. The apparatus of claim 1 wherein said cathode electrode means includes, an electrically conductive cathode disc, a hollow cylindrical externally threaded receiving member, and an internally threaded retaining ring for threadably mating with said external threads of said receiving member for clamping said cathode disc over the open end of said hollow cylindrical receiving member.

3. The apparatus of claim 2 wherein said magnet means is formed and arranged for disposition within said hollow interior of said cylindrical receiving means, and means for directing a flow of fluid coolant through a passageway defined within the hollow interior of said receiving means and disposed in heat exchanging relation with said cathode electrode disc for cooling thereof in use.

4. The apparatus of claim 3 wherein said insulator means comprises a plate of electrically insulative material, and means for fixedly securing said hollow cylindrical receiving member to a major face of said electrically insulative plate.

5. The apparatus of claim 4 wherein said electrically insulative plate is a circular disc and said floating shield means is cylindrical having an inwardly directed circular flange portion with an inside diameter less than the outside diameter of said cathode electrode such that said flange portion is disposed for overlying the periphery of said cathode electrode disc.

6. The apparatus to claim 5 wherein said cylindrical floating shield is affixed to the outer periphery of said circular insulative disc.

7. The apparatus of claim 1 wherein said cathode electrode means includes a circular target disc of cathode material forming said target region of said cathode means and which is to be sputtered and wherein said floating shield means is cylindrical having an inwardly directed circular flange portion having an inside diameter less than the outside diameter of said disc of cathode sputter material to be sputtered for overlying the periphery of said disc cathode sputter material.

8. In a magnetron sputter assembly of the type including anode and cathode electrode means operating at anode and cathode potential in use for sputtering target material from a target region of a major face of said cathode electrode means onto an object to be coated with the sputtered material:

magnet means for producing a magnetic field over said cathode electrode which has a substantial component orthogonally directed to the electric field over said cathode electrode and between said cathode electrode and anode electrode for enhancing the intensity of the glow discharge established over said cathode electrode in use;

means for applying a cathode to anode electrode potential to said anode and cathode electrode means for establishing an electrical glow discharge therebetween in use;

said cathode electrode means including a cathode disc structure as said target region and having an electrically conductive portion and a portion of said cathode structure being made of a material to be sputtered;

said cathode electrode means further including a clamp portion surrounding the peripheral region of said cathode target disc for holding said target disc in place and for clamping said target disc portion to other portions of said cathode electrode means, said clamping portion being made of a material which it is undesired to sputter;

sputter shield means surrounding said cathode disc and including an inwardly directed circular flange portion having an inside diameter less than the outside diameter of said cathode disc for overlaying said clamping portion of said cathode electrode means and shielding said clamping portion from undesired sputtering; and insulator means for electrically insulating said sputter shield means from said cathode electrode means and from said anode electrode means, whereby said sputter shield means is allowed to operate at an electrical potential intermediate the potentials applied to said anode and cathode electrodes in use.

9. The apparatus of claim 8 wherein said clamp portion of said cathode electrode means includes a hollow cylindrical externally threaded receiving member, and an internally threaded retaining ring threadably mating with said external threads of said receiving member for clamping said cathode disc member over the open end of said hollow cylindrical receiving member.

10. The apparatus of claim 9 wherein said magnet means is formed and arranged for disposition within said hollow interior of said cylindrical receiving member, and means for directing a flow of liquid coolant through a passageway defined within the hollow interior of said receiving member and disposed in heat exchanging relation with said cathode electrode disc for cooling thereof in use.

11. The apparatus of claim 10 wherein said insulator means comprises a plate of electrically insulative material, and means for fixedly securing said hollow cylindrical receiving member to a major face of said electrically insulative plate.

12. The apparatus of claim 11 wherein said insulative plate is a circular disc and said sputter shield means is cylindrical having said inwardly directed circular flange.

13. In a glow discharge sputtering method for coating a workpiece, the steps of:
producing crossed magnetic and electric fields over the major face of a cathode electrode including a target portion thereof being made of a material to be sputtered onto the workpiece, said target portion being surrounded by an outer peripheral region of said major face of said cathode electrode from which sputtering is undesired in use;
clamping the peripheral region of said target portion of said cathode electrode to other portions of said cathode electrode for holding said target portion in place:
overlaying the clamped peripheral region of said major face of said cathode electrode portion with a sputter shield electrode structure and operating said sputter shield electrode structure at a potential intermediate the operating potential of said cathode electrode and of an anode electrode structure producing the electric field over said major face of said cathode electrode in use, for confining sputtering of the cathode electrode to a desired region centrally located thereof and free of the overlayed peripheral clamping area of said cathode electrode.

14. The method of claim 13 wherein said sputter shield is operated at a self bias floating potential intermediate the operating potential of said anode and cathode in use.

* * * * *